United States Patent
Robinson

(10) Patent No.: US 8,691,657 B1
(45) Date of Patent: Apr. 8, 2014

(54) METHOD FOR PREVENTION OF CORONA EFFECT IN A MONOLITHIC MICROWAVE INTEGRATED CIRCUIT (MMIC)

(71) Applicant: Lockheed Martin Corporation, Bethesda, MD (US)

(72) Inventor: Kevin L. Robinson, Clay, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 14/029,384

(22) Filed: Sep. 17, 2013

Related U.S. Application Data

(62) Division of application No. 12/002,871, filed on Dec. 19, 2007, now Pat. No. 8,536,676.

(51) Int. Cl.
*H01L 21/02* (2006.01)

(52) U.S. Cl.
USPC ............ 438/396; 257/532; 257/E21.008; 257/E21.011; 438/239; 438/253; 438/439

(58) Field of Classification Search
USPC .......... 257/532, E21.008, E21.011; 438/239, 438/243, 250, 260, 329, 396, 439
See application file for complete search history.

(56) References Cited

U.S. PATENT DOCUMENTS

| | | | |
|---|---|---|---|
| 5,812,364 A | 9/1998 | Oku et al. | |
| 6,008,083 A | 12/1999 | Brabazon et al. | |
| 6,081,415 A | 6/2000 | Crawford | |
| 6,696,733 B2 | 2/2004 | Koike et al. | |
| 6,818,498 B2 | 11/2004 | Mikawa et al. | |
| 6,910,266 B2 | 6/2005 | Lee et al. | |
| 6,921,689 B2 | 7/2005 | Matsuhashi | |
| 7,098,501 B2 | 8/2006 | Kong et al. | |
| 7,973,246 B2 | 7/2011 | Kuwajima | |
| 2002/0000637 A1 | 1/2002 | Gerhard | |
| 2004/0246075 A1 | 12/2004 | Bradley et al. | |
| 2007/0063240 A1 | 3/2007 | Torres et al. | |
| 2007/0194384 A1 | 8/2007 | Robinson | |

OTHER PUBLICATIONS

International Search Report dated Feb. 24, 2009.
International Preliminary Report on Patentability dated Jun. 28, 2010.

*Primary Examiner* — John C Ingham
(74) *Attorney, Agent, or Firm* — Howard IP Law Group, PC

(57) ABSTRACT

Corona effect in a monolithic microwave integrated circuit (MMIC) is prevented by disposing a bottom metal layer on a substrate, defining a conductive via through the substrate electrically contacting the bottom metal layer, the conductive via further connected to a reference electrical potential, disposing a layer of dielectric material on a region of the bottom metal layer, forming a component metal layer over the conductive via and in electrical communication with the via and the bottom metal layer to define an electrical component, forming a top metal layer on the layer of dielectric material, the layer of dielectric layer interposed between the top metal layer and the bottom metal layer to thereby define an MMIC capacitor on the substrate, the top metal layer of the MMIC capacitor being separated from the electrical component, and disposing a passivation layer adjacent and conformal to a side wall of the top metal layer.

9 Claims, 4 Drawing Sheets

METHOD FOR PREVENTION OF CORONA EFFECT IN A MONOLITHIC MICROWAVE INTEGRATED CIRCUIT (MMIC)

CROSS REFERENCE TO RELATED APPLICATIONS

This application is a divisional application of U.S. patent application Ser. No. 12/002,871, filed Dec. 19, 2007, entitled CORONA PREVENTION FOR HIGH POWER MMICS, which is incorporated by reference herein as set forth in its entirety.

FIELD OF THE INVENTION

The present invention relates to integrated circuits formed in semiconductor materials and in particular relates to methods for forming corona protection in semiconductor substrates.

BACKGROUND OF THE INVENTION

Monolithic microwave integrated circuits (MMICs) designed to operate at microwave frequencies are typically manufactured on top of single semiconductor substrates. As is generally the case with integrated circuits, placing the circuit components on a single substrate saves space. From an electronic standpoint, integrated circuits help reduce or eliminate problems such as parasitic capacitance loss that can arise when discrete devices are wire-bonded to one another to form circuits. These advantages can help integrated circuits operate at improved bandwidths as compared to circuits that are "wired" together from discrete components.

The growth of technologies dependent on MMICs will require that devices become smaller, more powerful and easier to manufacture. These desired advantages apply to base, relay and switching stations as well as to end user devices such as cellular telephones or other portable electronic devices. Due in part to the expansion of devices using MMICs, there may exist an increased need to raise operating voltages within the devices. In many applications MMIC capacitors are needed to work in the 140 volt (140 V) range and this figure is expected to increase significantly over the next several years. However, increasing operating voltages results in problems with AC and DC corona effects due at least in part to relatively high electric fields, notably in the space between the high voltage side of the capacitor and the nearest ground. These high voltage levels and the circuit features around such voltages result in electric field strengths sufficient to generate partial discharge and the onset of corona. Corona often cause catastrophic failure of the MMIC. Increasing the space between components will not offer solutions to most corona occurrences since corona induced failures are not caused by the spacing between the high voltage side of the capacitor and the ground via.

Alternative techniques and mechanisms for corona prevention in MMICs are desired.

SUMMARY

In one embodiment of the invention an MMIC capacitor on a substrate is produced by disposing a metal bottom plate on the substrate, disposing a dielectric layer on a surface of the metal bottom plate and disposing a metal top plate over the dielectric layer such that the dielectric layer is interposed between the metal top plate and the metal bottom plate. Corona effect due to electric fields building between the top and bottom plates are prevented by placing a passivation layer comprising silicon nitride to fill a cavity adjacent and conformal to at least one side wall of the metal top plate, wherein a thickness of the passivation layer adjacent to the at least one side wall of the metal top plate extends vertically up the at least one side wall and is at least 1 micron, reducing an electric field by at least a factor of 4 to prevent corona effect.

BRIEF DESCRIPTION OF THE DRAWINGS

The invention is best understood from the following detailed description when read in connection with the accompanying drawings. The various features of the drawings are not specified exhaustively. On the contrary, the various features may be arbitrarily expanded or reduced for clarity. Included in the drawing are the following figures.

DETAILED DESCRIPTION

Figure 1:
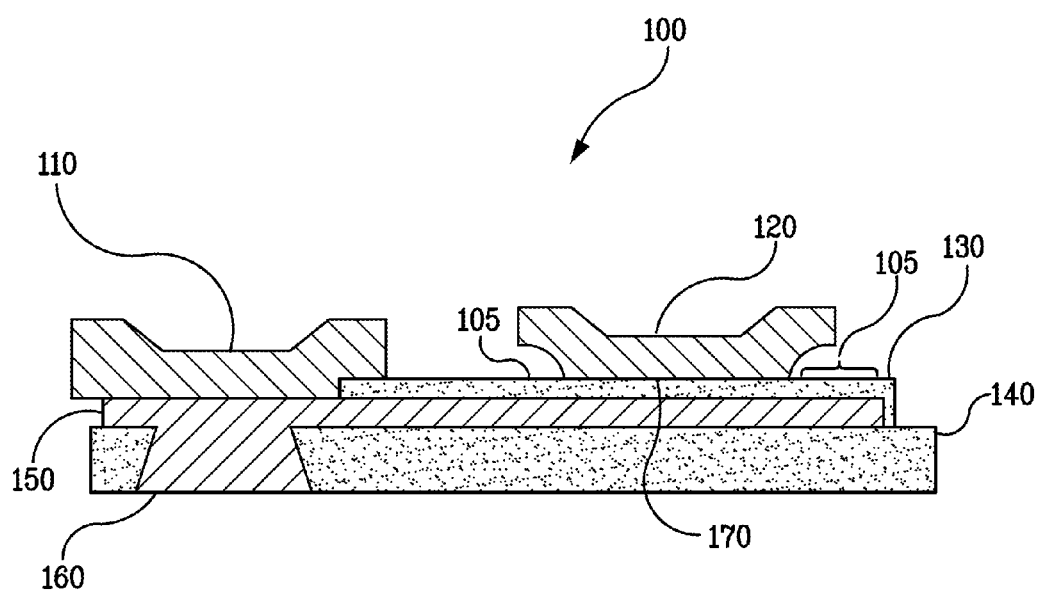
FIG. 1 is a plan view showing a prior art MMIC capacitor.

FIG. 1 illustrates a prior art MMIC capacitor 100 on a silicon carbide (SiC) substrate 140 and having a top plate 120, a dielectric material 130, such as silicon nitride (SiN) and a bottom plate comprised of a metal laminate 150 situated between a metal plate 110 and via 160. Via 160 serves to connect circuit metal laminate 150 to ground potential measured in relation to metal plate 120. Depending on the composition of the atmosphere (typically air or nitrogen) within which the electrical plates or components are situated, the geometrical shape of the electrical components (110, 120), and the dielectric material 130 and its thickness, potential voltage differences in excess of a given magnitude cause AC and DC coronas to occur in a region such as region 105 where the electric fields have the highest gradients and lines of concentration. As a frame of reference, the spacing between the top of the capacitor and the ground via metal is approximately 12 micrometers (12 um).

In the prior art depicted in FIG. 1 electric fields in the region 105 in excess of approximately 600 kilovolts per millimeter (600 KV/mm) in air produce damaging coronas.

Utilizing the configuration illustrated in FIG. 1, applying 120 Volts DC between the top plate 120 and the via 160 results in an electric field intensity due to fringing capacitance measured, at bottommost position 170 of the capacitor top plate, at approximately 600 kV/mm. A localized high electric field density of approximately 600 kV/mm in air causes a momentary partial discharge and in some instances a sustained corona. The high electric field intensity is believed due to the fringing fields at the capacitor and not the spacing between the top plate 120 of the capacitor and the ground via 160. An electric field intensity of 600 kV/mm is approximately four to ten times the maximum permissible value to prevent corona from occurring in an air environment.

Therefore, to prevent corona effects a maximum 150 kV/mm is desirable in the vicinity of the top plate 120 surface including the side walls and at the SiN junction at 170. The incorporation of an SiN passivation layer of thickness at least 1 um or greater and that conforms to the sides of the capacitor top plate 120 reduces the electric field to levels that inhibit the production of partial discharge and inception of corona in air. A thicker dielectric beneath the top plate 120 also reduces the electric field in the air that envelopes the top plate 120; however this approach affects capacitance.

One available option to reduce the effects of corona at high voltages is to increase dielectric thickness of dielectric material 130. However, increasing the dielectric material 130 thickness, although allowing for higher voltage operation and reducing electric field strength, also reduces capacitance per unit area. A greater area for a given capacitor results in a higher MMIC cost per capacitor. Another option to reduce the effects of corona at high voltages is to increase top conductor pullback region 105 to reduce surface flashover from the top electrode 120 to bottommost junction 170. This technique however, does not actually or effectively reduce the electric field strength near the capacitor in the region 105. Essentially increasing the pull back region 105 reduces the adverse DC corona effects, but not the AC corona adverse effects.

Figure 2:
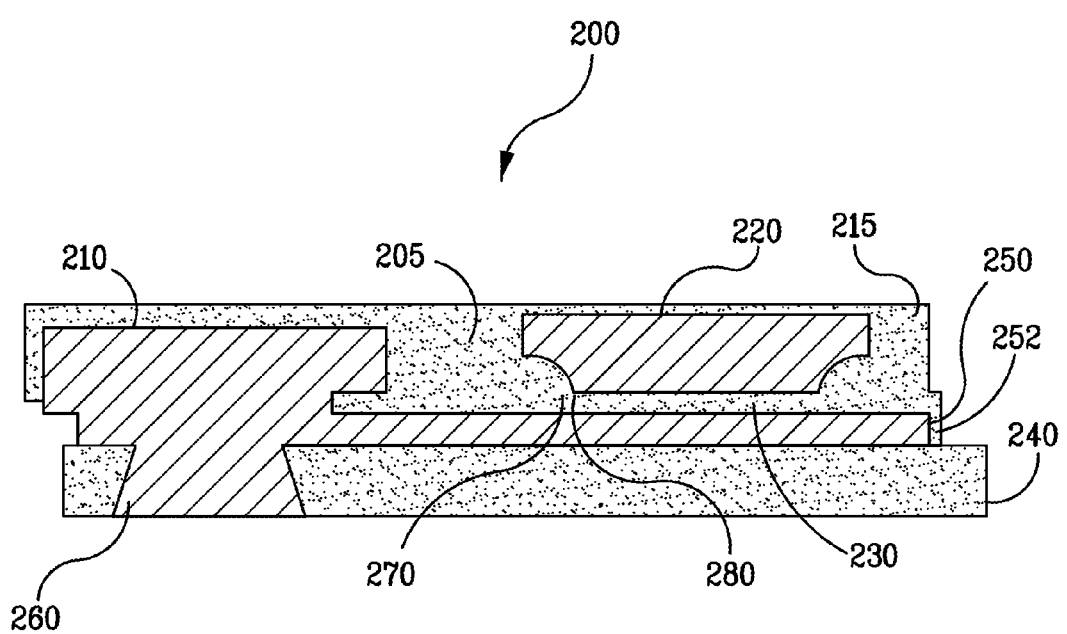
FIG. 2 is a plan view showing a MMIC capacitor according to an embodiment of the present invention.

FIG. 2 illustrates a non-limiting embodiment of the invention wherein an MMIC capacitor 200 comprises a dielectric material 230 interposed between a metal top plate 220 and a metal bottom plate 250, which rests on a SiC substrate 240; a passivation layer 215 encapsulates the exposed top plate 220 surface area and has a thickness sufficient to reduce a corona effect, thus eliminating a troublesome failure mode for high voltage MMIC capacitors. Adding the passivation layer 215 has the effect of increasing the voltage rating on the capacitor. The bottom metal plate is typically a metal laminate 250 such as gold, aluminum or copper situated between the top metal plate (e.g. 210) and metal via 260.

Via 260 serves to connect metal laminate 250 to a potential, which for illustration is considered ground in relation to metal plate 220. The region 205 composition is no longer filled by air or nitrogen, but consists of the passivation layer 215 having a certain minimum thickness relative to the space adjacent to the metal plate 220. The layer 215 has a dielectric constant which is nominally the same as the dielectric material 230 that serves as the dielectric material required for the capacitor to store electronic charge. By way of example only, such dielectric material may include SiN, SiO, SiON and HfO. By a conformal filling of the volume of the region 205 with the dielectric material layer 215 the influence of the geometrical configuration of the electrical components (210, 220) is reduced and therefore the creation of electric fields that can cause inception and sustaining of AC and DC coronas in a region such as regions 205, 280 is eliminated. Essentially, the introduction of the dielectric material passivation layer 215 reduces the electric field gradients in the lower breakdown air and lines of concentration to below those capable of producing corona effects. The introduction of dielectric material 215 moves the maximum electric field gradient in air to a location with reduced electric field gradient. In FIG. 2 electric fields in the region 270 in the approximate magnitude of 600 KV/mm do not produce damaging coronas because these fields are completely contained in the higher breakdown dielectric material.

Figure 3:
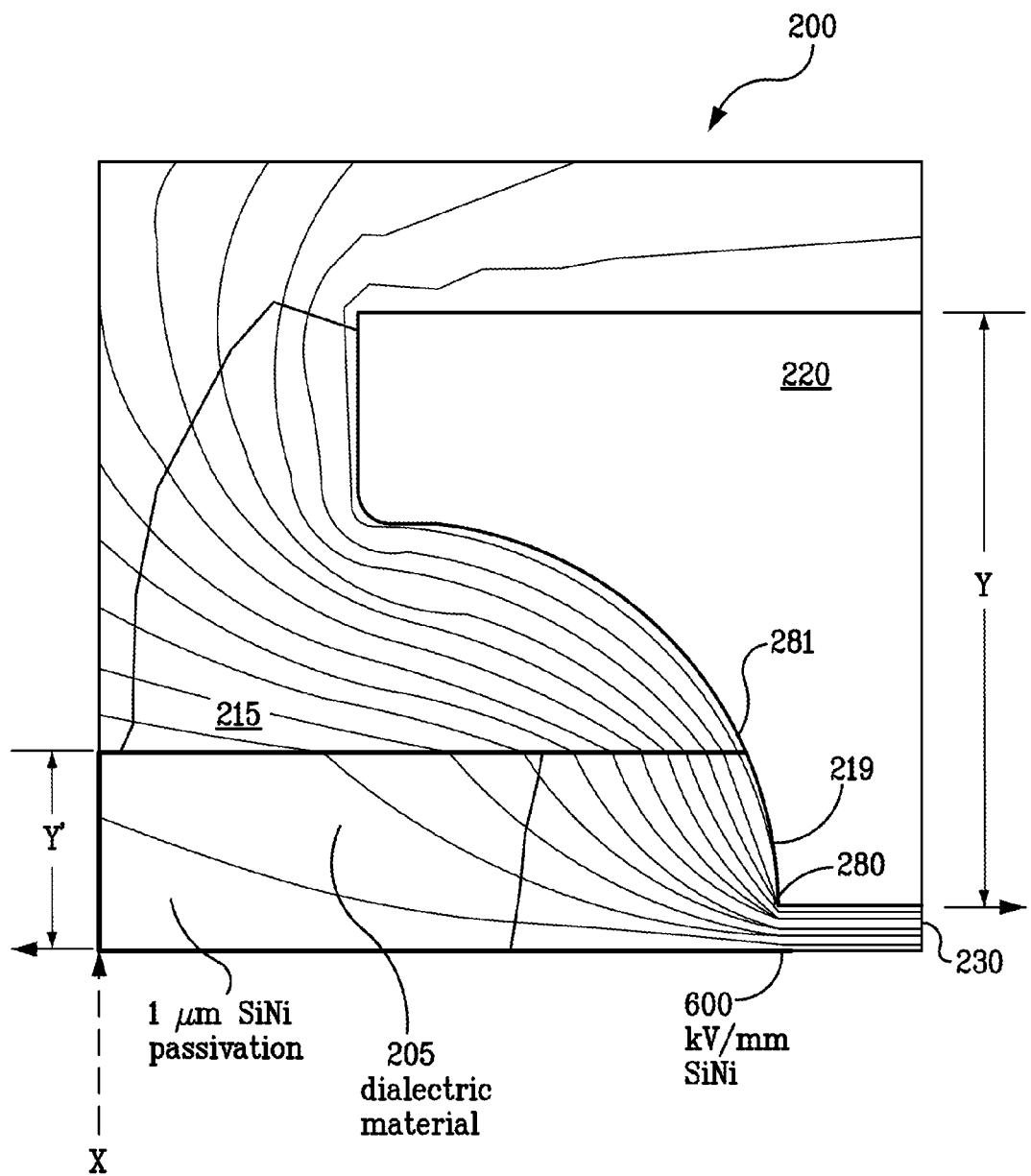
FIG. 3 is a magnified side view showing the exemplary MMIC capacitor of FIG. 2 showing gradients and lines of concentration according to an embodiment of the present invention.

FIG. 3 illustrates a magnified side view of an exemplary configuration in the region 205, 280 (see also, FIG. 2). The capacitor top plate 220 is encapsulated in a volume of dielectric material layer 215 of an SiN passivation horizontally extending at least to a boundary designated X. In FIG. 3 the SiN passivation dielectric material 215 extends approximately 1 um vertically, designated as Y', up the left wall 219 of the metal plate 220. The electric field in the SiN dielectric material 230 is shown to be 600 kV/mm. The electric field adjacent to the region encapsulated by the SiN passivation 215, for example in the vicinity 281 adjacent to the dielectric material 230, is shown to be reduced to 140 KV/mm or a 4.3 times reduction in the strength of the electric field compared to the electric field in the prior art in air (FIG. 1).

The inventor has determined that a configuration of a least height dielectric material passivation layer 215 of dimension Y' relative to the top plate 220 vertical dimension Y sufficiently reduces the electric field strength to non corona levels. The high electric field strength of 600 kV/mm is completely contained in dielectric material capable of withstanding that electric field strength and not in air, which cannot support this level of electric field strength without corona. Furthermore, it is desirable that the passivation dielectric material layer 215 be of a material nominally the same composition as the dielectric material 230 or has the nominal equivalent of the dielectric constant as the dielectric material 230. In an exemplary embodiment, the dimensions X, Y, and Y' are 5 um, 4 um, and 1 um, respectively.

Figure 4:
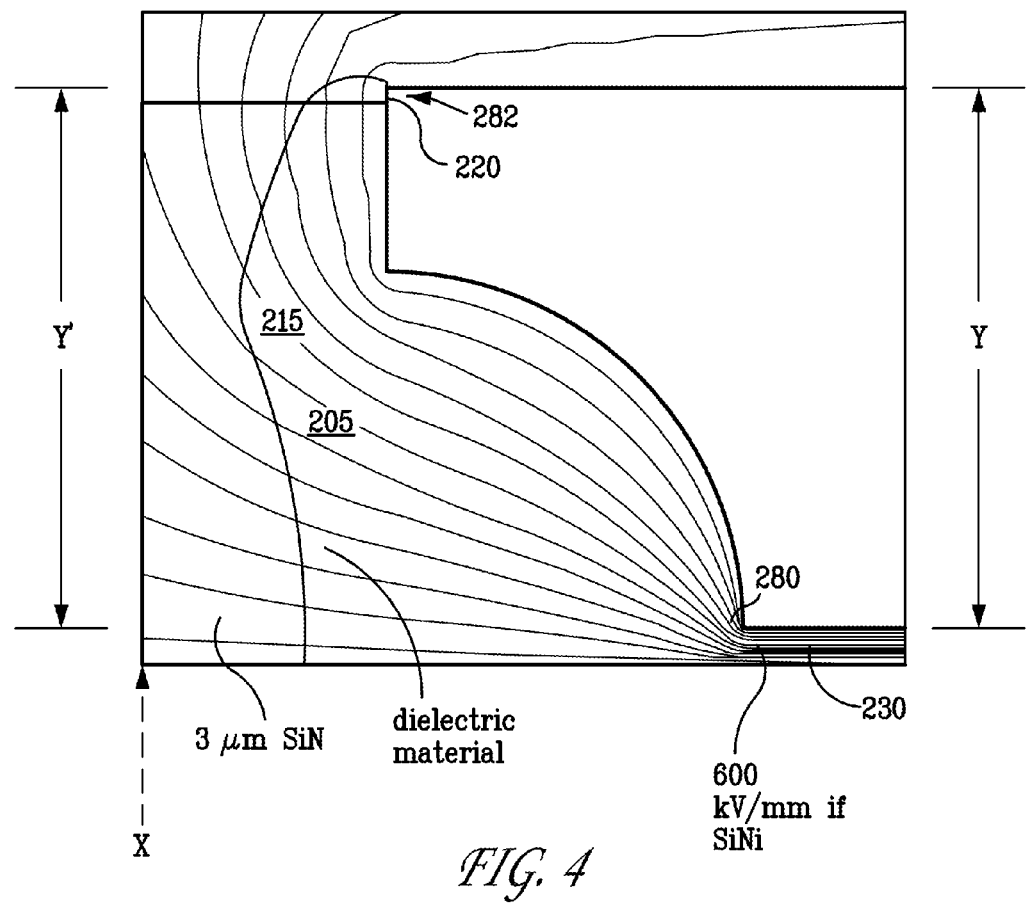
FIG. 4 is a magnified plan view showing a MMIC capacitor with gradients and lines of concentration according to an embodiment of the present invention.

In FIG. 4 a region 205, 280 is encapsulated in a volume of dielectric material layer 215 of an SiN passivation having a horizontal dimension extending at least to a boundary designated X. The SiN passivation is extended vertically (Y') up the wall of the metal plate 220 circuit trace at least 3 um in this example. The electric field in the SiN capacitor's dielectric material 230 is again shown to be 600 kV/mm. The electric field within the region encapsulated by the air layer 282 is shown to be reduced to 45 KV/mm or a 13.3 times reduction in the strength of the electric field compared to the electric field in the prior art (FIG. 1).

One embodiment of the invention is a method of producing a MMIC capacitor such as shown in FIG. 2 and FIG. 3 comprising the steps of: forming an SiN dielectric material on an SiC substrate, interposing a dielectric material such as dielectric material 230 between the metal top plate 220 and the metal bottom plate 250 in electrical contact with metal via 260; and encapsulating a portion of the top plate by passivating a layer 215 of SiN having a thickness Y' to reduce a corona effect.

In another embodiment of the invention a process comprises the steps of applying a coating of SiN or other suitable dielectric material at the point of maximum electric field strength such as shown in FIG. 2 to capacitor 200; encapsulating top metal conductor 220 and high electric field locations in dielectric material layer 215, thus reducing high electric field strengths surrounding the MMIC capacitor 200 elements and increasing the operating voltage on the MMIC capacitor 200 while eliminating damage to capacitor elements due to corona discharge.

In yet another embodiment, the invention relates to a process for using the MMIC capacitor 200 comprising the steps of: applying the coating of dielectric material layer 215 at the point of maximum electric field strength thereby encapsulating top conductor 220 and all high electric field locations surrounding the MMIC capacitor 200 and increasing the operating voltage on MMIC capacitor to greater than 50 volts without causing damage to capacitor elements due to corona discharge.

Thus, in accordance with embodiments of the present invention and with reference to FIG. 2, in a capacitor 200 having a substrate 240 containing a conductive via 260, a top conductor 220, and a bottom conductor 250 in electrical communication with the conductive via, and a metal via top plate 210 in electrical communication with the via 260 through the bottom conductor 250, a method of reducing corona effect comprises encapsulating the top conductor 220 and the metal via top plate 210 with a dielectric material 215.

The method further comprises disposing the dielectric over an end wall 252 of the bottom conductor 250.

The foregoing invention has been described with reference to the above described MMIC embodiments having a capacitor with conductive plates and a dielectric. However the invention applies to any semiconductor having components affected by the production of electric fields that initiate and produce coronas. The foregoing invention applies, in addition to the monolithic microwave integrated circuit ("MMIC") described, to any circuit formed of a plurality of devices in which the circuit components are manufactured on top of a single semiconductor substrate, including fabrication incorporating elements such as but not limited to SiC, Gallium Nitride, Gallium Arsenide, Indium Phosphide, Silicon, Silicon Germanium or combinations thereof.

While the foregoing invention has been described with reference to the above described embodiment, various modifications and changes can be made without departing from the spirit of the invention. Accordingly, all such modifications and changes are considered to be within the scope of the invention.

What is claimed is:

1. A method for preventing corona effect in a monolithic microwave integrated circuit (MMIC) comprising the steps of:
    disposing a bottom metal layer on a substrate;
    defining a conductive via through the substrate in electrical contact with the bottom metal layer, the conductive via further connected to a reference electrical potential;
    disposing a layer of dielectric material on a region of the bottom metal layer;
    forming a component metal layer over the conductive via and in electrical communication with the via and the bottom metal layer to define an electrical component;
    forming a top metal layer on the layer of dielectric material, the layer of dielectric material being interposed between the top metal layer and the bottom metal layer to thereby define an MMIC capacitor on the substrate, the top metal layer of the MMIC capacitor being separated from the electrical component; and
    disposing a passivation layer adjacent and conformal to a side wall of the top metal layer, in an amount sufficient to reduce an electrical field of approximately 600 kV/mm within a region of the passivation layer by at least a factor of 4 to prevent corona effect.

2. The method of claim 1, wherein the step of disposing the passivation layer comprises extending the passivation layer from a side wall of the top metal layer to a side wall of the component metal layer.

3. The method of claim 2, further comprising encapsulating the MMIC capacitor with the passivation layer and filling the void separating the MMIC capacitor and the electrical component with the passivation layer.

4. The method of claim 1, wherein a thickness of the passivation layer is at least 1 μm.

5. The method of claim 1, wherein the top metal layer has a thickness of approximately 4 μm, the passivation layer has a thickness of approximately 1 μm, and wherein the passivation layer extends from the sidewall of the top metal layer at its junction with the dielectric material layer a lateral distance of approximately 5 μm.

6. The method of claim 1, wherein the passivation layer comprises Silicon Nitride (SiN).

7. The method of claim 6, wherein the dielectric layer comprises SiN.

8. The method of claim 7, wherein the substrate comprises Silicon Carbide (SiC).

9. The method of claim 1, wherein the top surface of the top metal layer extends laterally to define a first width, and the bottom surface of the top metal layer in contact with the dielectric material layer extends laterally defining a second width that is less than the first width, and wherein a side wall of the top metal layer extends from an edge of the bottom surface of the top metal layer in a curvilinear profile toward the edge of the top surface of the top metal layer.

\* \* \* \* \*